(12) United States Patent
Schmegner et al.

(10) Patent No.: US 7,982,484 B2
(45) Date of Patent: Jul. 19, 2011

(54) SYSTEM FOR MAKING CONTACT BETWEEN A TRANSMIT/RECEIVE MODULE AND A TESTING DEVICE

(75) Inventors: Karl-Ernst Schmegner, Nersingen (DE); Thomas Johannes Mueller, Erbach (DE); Georg Hoefer, Lonsee (DE); Rainer Rittmeyer, Ulm (DE)

(73) Assignee: EADS Deutschland GmbH, Ottobrunn (DE)

( * ) Notice: Subject to any disclaimer, the term of this patent is extended or adjusted under 35 U.S.C. 154(b) by 186 days.

(21) Appl. No.: 12/392,712

(22) Filed: Feb. 25, 2009

(65) Prior Publication Data

US 2009/0212806 A1 Aug. 27, 2009

(30) Foreign Application Priority Data

Feb. 26, 2008 (DE) .......................... 10 2008 011 240

(51) Int. Cl.
*G01R 31/26* (2006.01)
*G01R 31/20* (2006.01)

(52) U.S. Cl. ......... 324/762.01; 324/750.24; 324/750.25; 324/762.02

(58) Field of Classification Search .............. 324/158.1, 324/754–765
See application file for complete search history.

(56) References Cited

U.S. PATENT DOCUMENTS

| 5,099,201 | A | 3/1992 | Rivoir |
|---|---|---|---|
| 6,774,742 | B1 * | 8/2004 | Fleury et al. ............... 333/33 |
| 6,911,835 | B2 * | 6/2005 | Chraft et al. ............... 324/754 |
| 7,109,739 | B2 * | 9/2006 | Gothoskar et al. ......... 324/765 |
| 7,173,442 | B2 * | 2/2007 | Treibergs et al. ....... 324/750.25 |
| 7,368,927 | B2 * | 5/2008 | Smith et al. ........... 324/754.07 |
| 7,405,582 | B2 * | 7/2008 | Mineo et al. .............. 324/755 |
| 7,463,048 | B2 * | 12/2008 | Bhatti ................... 324/750.27 |

FOREIGN PATENT DOCUMENTS

| DE | 39 38 427 A1 | 5/1991 |
|---|---|---|
| DE | 197 41 944 A1 | 3/1999 |

* cited by examiner

*Primary Examiner* — Ha Tran T Nguyen
*Assistant Examiner* — Joshua Benitez
(74) *Attorney, Agent, or Firm* — Crowell & Moring LLP (57) ABSTRACT

A system for making electrical contact between a transmit/receive module and a testing device for the transmission of high-frequency signals includes a mechanically guided, frame-shaped contacting unit having a plurality of contact elements for contacting the TR module. The contacting unit surrounds the T/R module and is positioned relative to the T/R module such that the contact with the T/R module is established in one operation via the contact elements. A line substrate, which is arranged on the contacting unit and electrically connected with it, is constructed as a shielded triplate line by which the high-frequency signals can be conducted to the testing device.

12 Claims, 7 Drawing Sheets

Section B-B

- Through Platings
- Contact Points for Spring Contact Pins

SYSTEM FOR MAKING CONTACT BETWEEN A TRANSMIT/RECEIVE MODULE AND A TESTING DEVICE

BACKGROUND AND SUMMARY OF THE INVENTION

This application claims the priority of German patent application 10 2008 011 240.2-035, filed Feb. 26, 2008, the disclosure of which is expressly incorporated by reference herein.

The invention relates to a system for connecting a transmit/receive (T/R) module to a testing device, particularly in the case of active antennas in the high-frequency range.

According to the state of the art, T/R modules (which in this case constitute a test item) can be contacted and evaluated by installation in special testing mounts. The high-frequency connection to the tester environment is established by coaxial connectors, and the high-frequency connection to the test item is established by adaptors with bonded wires and/or small bands. The supply of direct current and connection to the control signals are effected in a similar manner. After the test has taken place, the bonded connections are removed again, but remnants of the connection and visible traces remain on the connecting pads of the test items.

Alternatively, such mechanically high-expenditure (and also not traceless or residue-free) contact with test items may be provided by needle adapters for the low-frequency control or direct-current supply.

For this purpose, the high-frequency signals are fed via special coaxial test probes (high-frequency probes). In this type of contact, both the needles and the test probes leave traces (scratches) on the connecting pad during the contacting, and such traces (scratches) could impair further processing of the modules (installation into a system by bonding connection). In addition, for reasons of space and high-frequency-related demands, the connecting pads are kept very small. Therefore, in order to ensure secure contact of the modules for the measurement, both the test item and the test probes must be optically aligned manually with one another using a microscope, independently of another. Only this fairly high-expenditure approach ensures that the individual mechanical tolerances of the test items do not disturb the electrical characteristics of the modules. It should further be noted that the quality of the contact has a direct effect on the quality of the measuring results, and qualitatively high-value contacts are achieved only by experienced operating personnel.

In this type of contacting, the respective testing probes must be aligned individually, typically by using optical methods under a microscope, which is very time-consuming. Furthermore, the quality of the contacting is highly dependent on the skill of the operating personnel.

One object of the present invention, therefore, is to provide a system for contacting T/R modules which eliminates the disadvantages of the above-described contacting methods.

Another object of the invention is to achieve a high quality contact that is easy to handle and can be reproduced.

These and other objects and advantages are achieved by the system according to the invention, in which the optical alignment of the test item is replaced by mechanically guiding and centering a frame-shaped contacting unit on the frame of the T/R module to be tested, so that all connections can be made in a single operation. A line substrate (constructed as a shielded triplate line) arranged on the contacting unit establishes the connection to the connection ports of the testing device. The contacting unit has contact elements (for example, spring contact pins) connecting the line substrate with the corresponding contact pads of the T/R module.

The requirement for individual alignment of the testing probes with the test item in order to assure secure and reliable connection to the T/R modules, is eliminated by the contacting system according to the invention, as is the need for viewing through a microscope.

All required contacts (i.e., in addition to the high-frequency, low-frequency or DC signals) can be reliably and simultaneously closed in one operation.

With the system according to invention, the quality of the contact is largely independent of the skills of the operating personnel, thereby ensuring that the characteristics of the test items are accurately represented.

Another advantage of the system according to the invention is that calibration of the test setup, for which the same contacting principle can be used, can be carried out very simply. The calibrating elements for this purpose have the same construction as the line substrate, and have co-planar lines of different lengths which are mounted on a metal carrier. The metal carrier has an outer contour that approximates the test item, and can be inserted into the testing mount and contacted equally as easily as the T/R modules. No additional expenditures are required for adjusting and aligning for this purpose. Even the inserting sequence can be predefined by the control program for the operator.

Other objects, advantages and novel features of the present invention will become apparent from the following detailed description of the invention when considered in conjunction with the accompanying drawings.

DETAILED DESCRIPTION OF THE DRAWINGS

Figure 1:
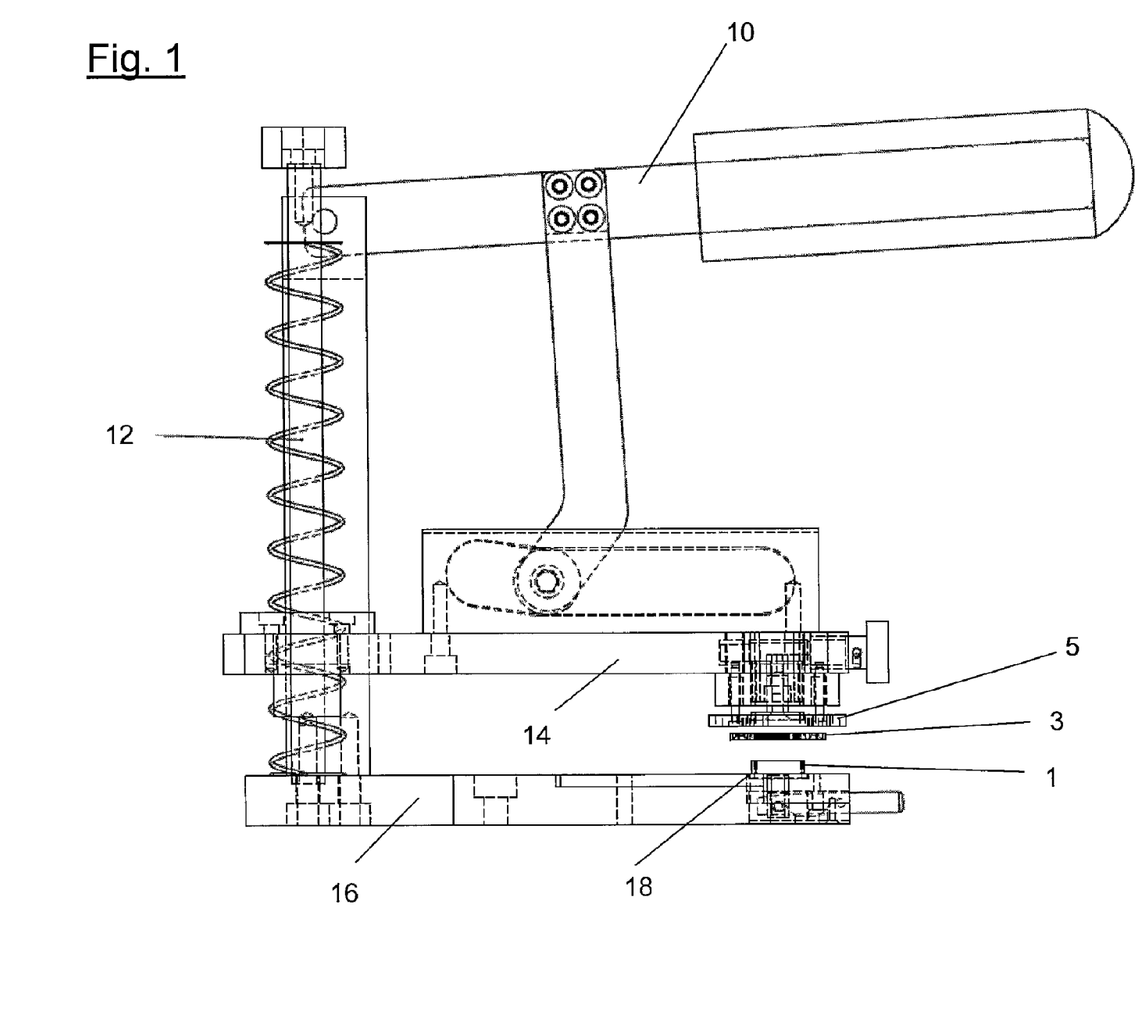
FIG. 1 is a lateral view of a system according to the invention for making contact using mechanical guidance.

FIG. 1 is an overall view of the system according to the invention. For mechanical preadjustment, the T/R module 1 is placed in a trough 18 in the base plate 16 of the system. The line substrate 5 with the contacting unit 3 arranged on its underside is arranged on a movable plate 14. The line substrate 5 and the contacting unit 3 are electrically connected with one another via several contacts, as explained in detail below. (For improved clarity, the contacting unit 3 is shown separately from the line substrate 5 in FIG. 1; in actual operation, however, it is arranged displaced upwardly in a recess of the line substrate 5, flush with its underside, so that it would not be visible in this lateral view.) The line substrate 5 as well as the contacting unit 3 are constructed in the form of a rectangular frame which is open in the interior and which is illustrated in FIGS. 2 and 3.

The movable plate 14 and the line substrate 5, with the contacting unit 3 arranged thereon can be displaced parallel in their vertical position by means of an upward or downward movement of the lever 10. (During a downward movement, the pressure spring 12, must be overcome.)

For contacting the T/R module 1, which is roughly prepositioned in the trough 18, the lever 10 is moved downward, so that the frame-shaped contacting unit 3 moves downward and encloses the outer frame of the T/R module 1. In this manner, it is thereby centered and unambiguously positioned relative to the T/R module 1. (The mechanical lever device has the play required for this purpose.) As a result, the contact elements (here: spring contact pins) of the contacting unit 3 are simultaneously connected with the corresponding contact elements (here: contact surfaces) on the T/R module 1, and the contact to the T/R module 1 is established.

Figure 2:
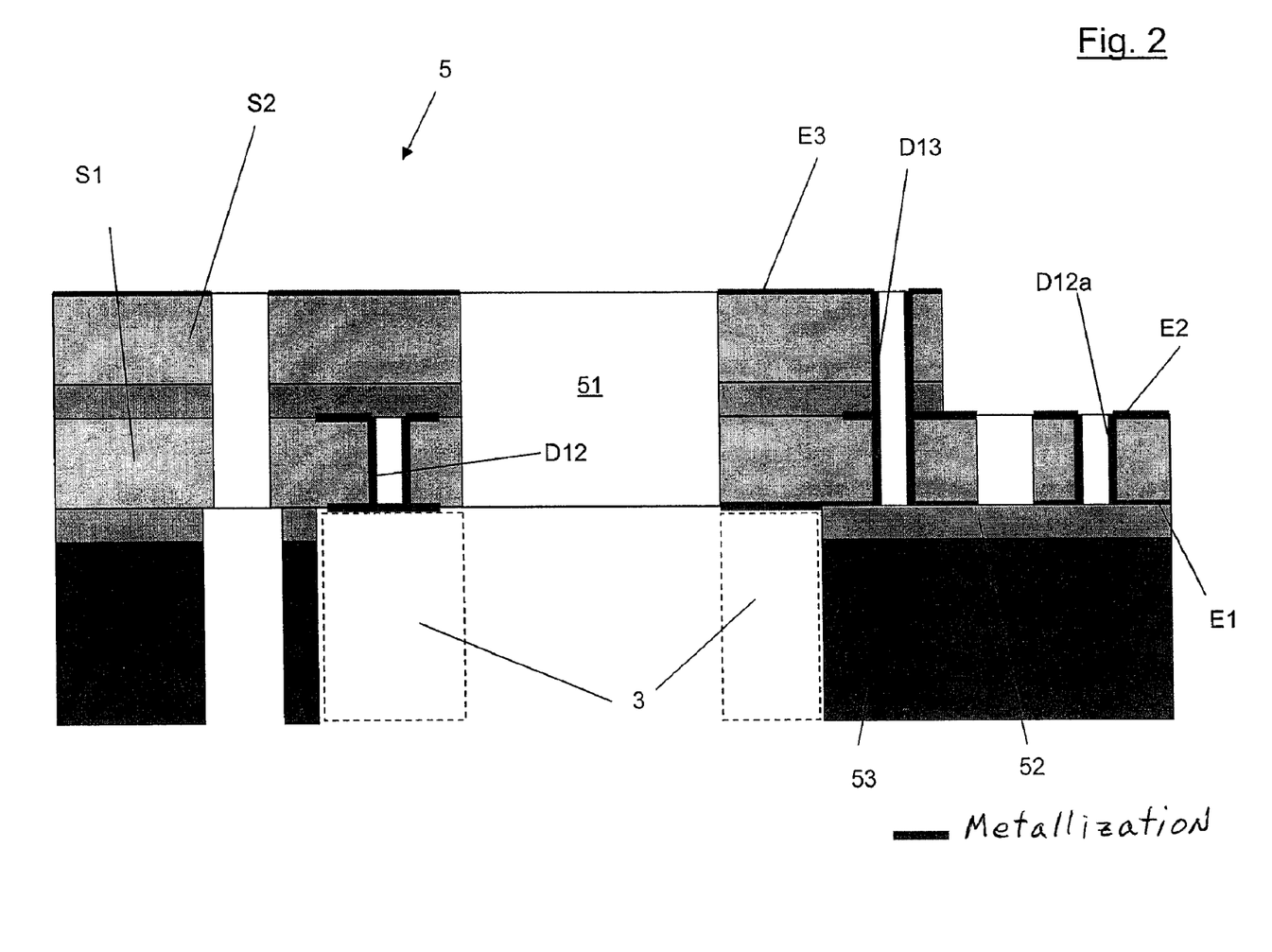
FIG. 2 is a cross-sectional view of a line substrate.
Figure 3:
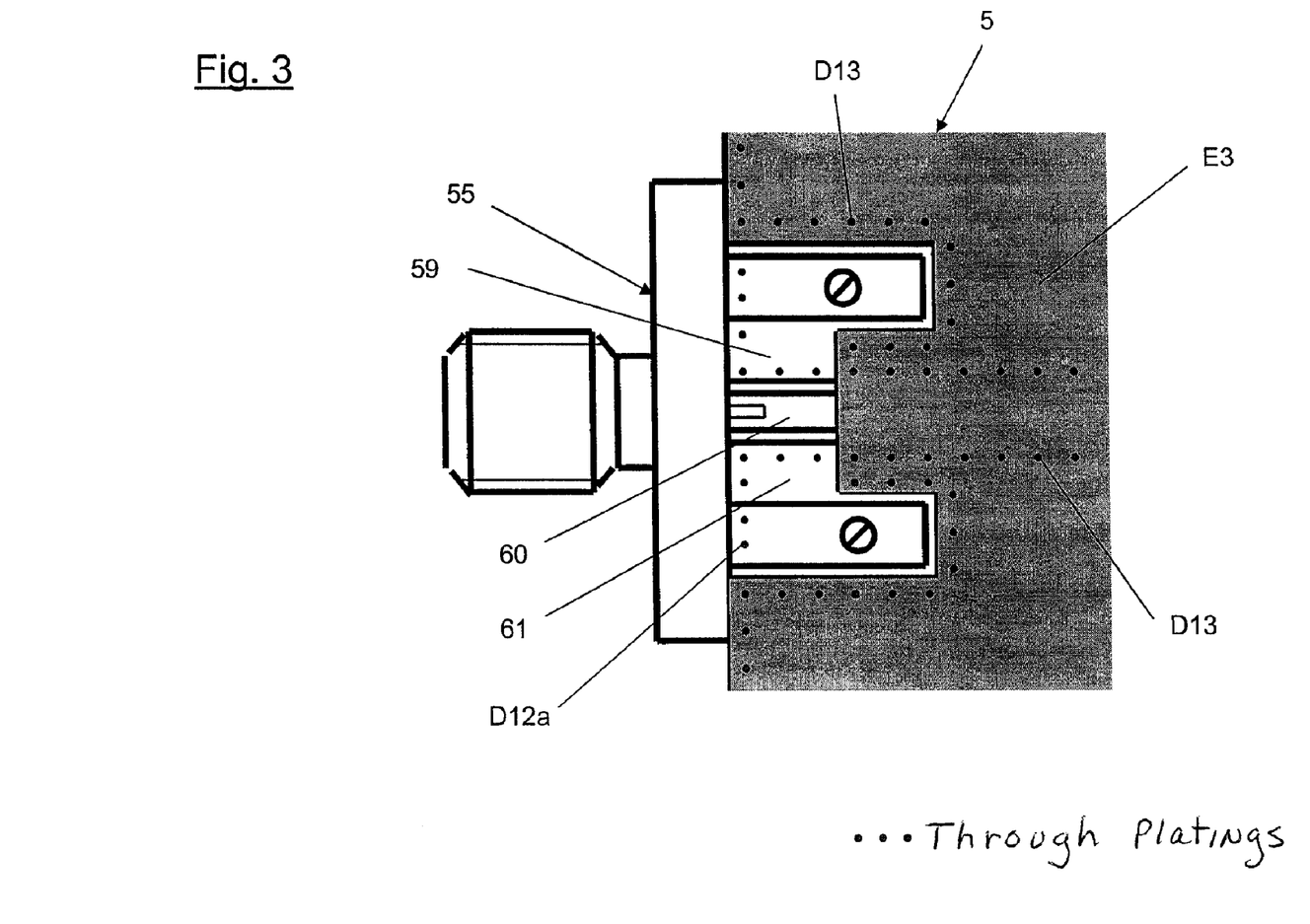
FIG. 3 shows the connection of a coaxial connector at the end of the line substrate.

FIG. 2 is a cross-sectional view of the line substrate 5, which is constructed as a so-called shielded triplate line. The latter comprises three parallel metallization planes E1, E2, E3 separated by two substrates S1, S2, with the center metallization plane E2 being divided into three separate (coplanar) individual conductors having a central inner conductor.

Because the line substrate 5 has the shape of a rectangular frame, it surrounds an open inside area (which may be achieved, for example, by milling out a closed substrate). It is glued by adhesive 52 onto a carrier plate 53 made of aluminum. The position of the contacting element 3, which is also frame-shaped, is outlined by broken lines.

Metallized throughplatings D12, D12a, D13 from the bottom side metallization plane E1 (which is situated toward the module) to the metallization plane E3 (which is away from the module), as well as from the bottom side metallization plane E1 to the central metallization plane E2, are situated within the line substrate 5. These are used for either conducting the high-frequency signal, or for suppressing any type of bridging by higher modes. Boreholes without metallization also contained in FIG. 2 are used for the mechanical fastening of the parts with respect to one another.

At one end, the line substrate 5 has a transition from the shielded triplate line to a shielded coplanar line. For this purpose, the top metallization plane E3, which is situated away from the module, and the top substrate S2 were removed to the center metallization plane E2. In this area, the connector can be mounted for connection of a coaxial line of the testing device.

In order to suppress the excitation of higher modes, which can propagate out along the connector flange and then farther between the line substrate 5 and the metallic carrier plate 53, in the transition area, a conductive adhesive foil is advantageously used as the adhesive layer 52.

FIG. 3 is a top view of the transition area of the line substrate 5, with a coaxial connector 55 already having been connected. The top metallization plane E3, situated away from the module, and the substrate S2 situated underneath were removed to the extent necessary for mounting the connector 55. As a result, the three coplanar single conductors (inner conductor 60, outer conductors 59, 61) of the central metallization plane E2 are exposed in this area. The inner conductor 60 is connected with the inner conductor of the coaxial connector 55.

For suppressing higher modes along the outer contour of the coaxial connector, throughplatings D13 are provided between the two outer metallization planes E1, E3 of the triplate line. For the same purpose, additional throughplatings D12a are present along the connector flange between the bottom metallization plane E1 close to the module and the central metallization plane E2.

For shielding the high-frequency signal, additional throughplatings D13 are provided between the module-side E1 metallization plane and the metallization plane E3 away from the module, on both sides along the inner conductor 60 of the central metallization plane E2. In the transition area, in which the top metallization plane E3 is not present, these throughplatings which are parallel to the inner conductor connect the bottom metallization plane E1, which is close to the module, and the central metallization plane E2.

Figure 4:
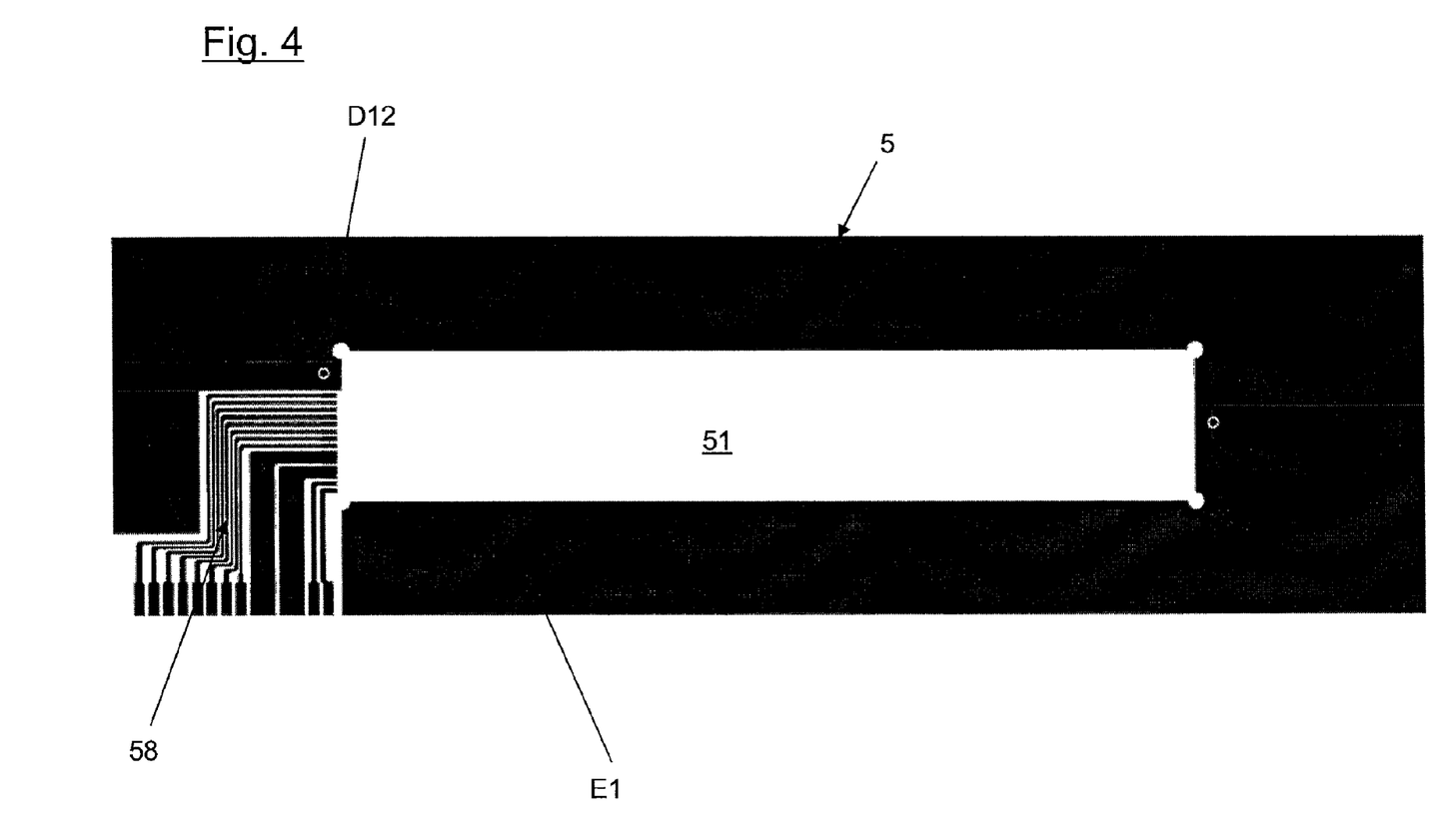
FIG. 4 is a bottom view of a line substrate.

FIG. 4 shows the line substrate 5 from the bottom (i.e., viewed from the T/R module). This figure illustrates the module-side metallization plane E1 in its rectangular frame-shaped construction with an interior opening 51.

The throughplating D12 conducts the high-frequency signal from the T/R module to the central metallization plane E2 of the triplate line, as will be explained in greater detail below in connection with FIG. 7.

The line structures 58 for the direct current (power supply) worked into the metallization plane E1 and control signals are also illustrated. These line structures comprise contact surfaces for contacting via spring contact pins of the contacting unit. The direct-current signals and the control signals can be conducted on this plane directly to a conductor card (not shown) and, from there, can be transmitted by multiple-pole connectors to the measuring instruments of the testing device.

Integration of the power supply mounted on the separate conductor card into the line substrate has several advantages. Thus, short line connections can be implemented, which are required for an interference-free operation of the T/R modules. The same applies to high-frequency connections. Short connection paths are advantageously implemented in the construction of the line substrate and also in the additional connecting structures for suppressing or avoiding undesired couplings and/or resonance effects.

Figure 5:
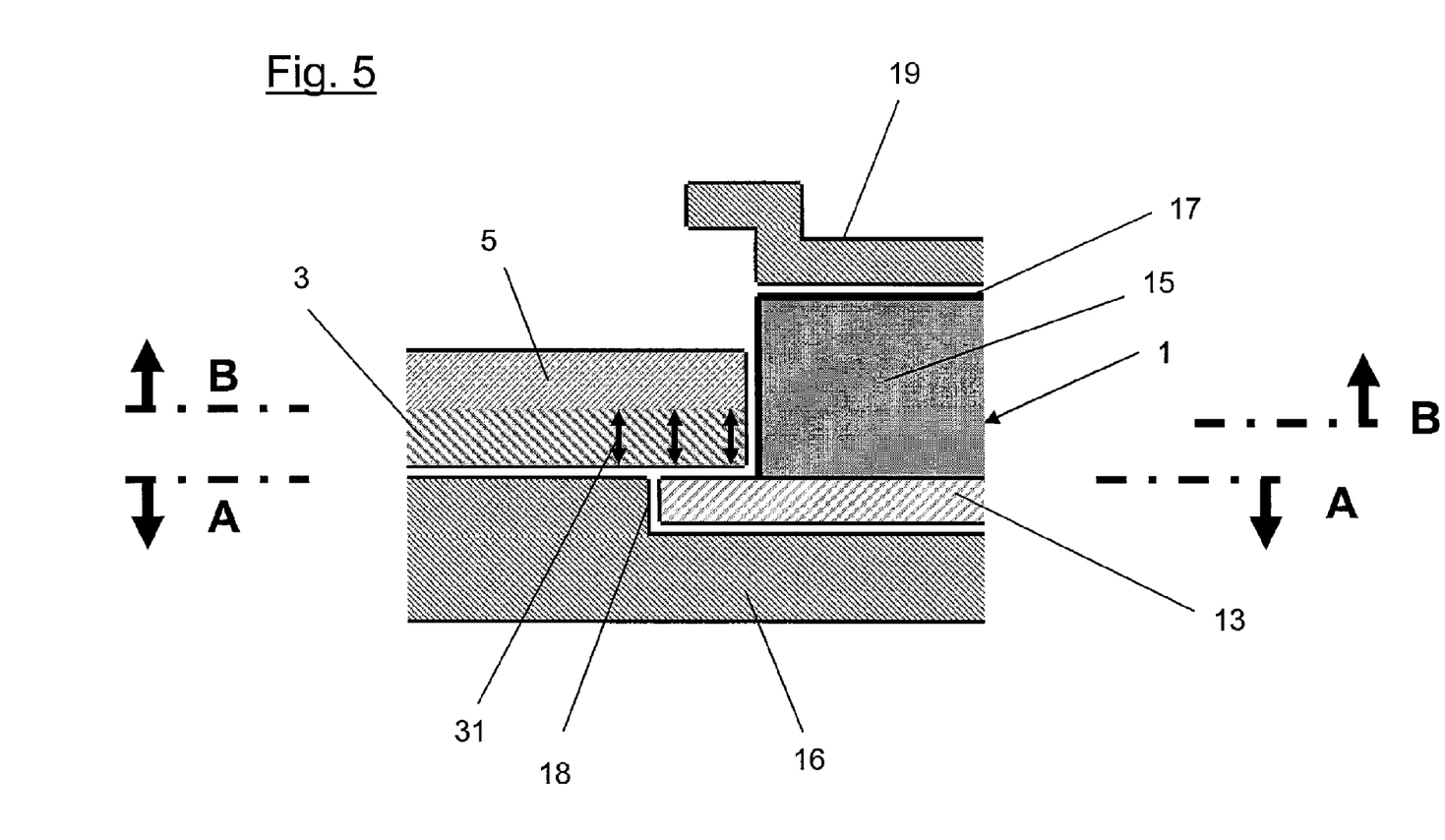
FIG. 5 is a cross-sectional view of a system according to the invention with the contacted T/R module.

FIG. 5 is a cross-sectional view of the system according to the invention with a contacted T/R module 1. The latter comprises a base plate 13, with contact surfaces on its top side (FIG. 6), as well as a module housing with a frame 15 and a lid 17. The module 1 is disposed in a trough 18 made of an electrically conductive material inside the base plate 16 of the system. The line substrate 5 and the contacting unit 3 arranged thereon surround the frame 15 of the module 1 from all four peripheral sides (not visible in this manner in FIG. 5 because this figure shows only one side of the arrangement). Within the contacting unit 3, electric contact elements 31 are illustrated, which in this case are constructed as spring contact pins that establish electrical contact between the T/R module 1 and the line substrate 5.

By means of the system according to the invention, not only closed modules can be measured but even open modules are also subjected to a preliminary test. To ensure an electrically effective covering of the open modules, a pressure plate 19 may be provided in the part of the system that moves down from above. This pressure plate 19 presses the lid 17, which in this case rests loosely on top, onto the frame 15 of the module 1. To suppress surface waves which propagate from the output side of the module 1 between the contacting unit 3 of the module frame 15 and farther on the surface of the module lid 17 as well as between the contacting unit 3 and the module frame 15 to the input of the module 1, the pressure plate 19 is step-shaped at least at one of its edges, as illustrated in FIG. 5. This shape of the pressure plate 19 causes a sufficiently high disturbance (interruption) of the described propagation path.

Figure 6:
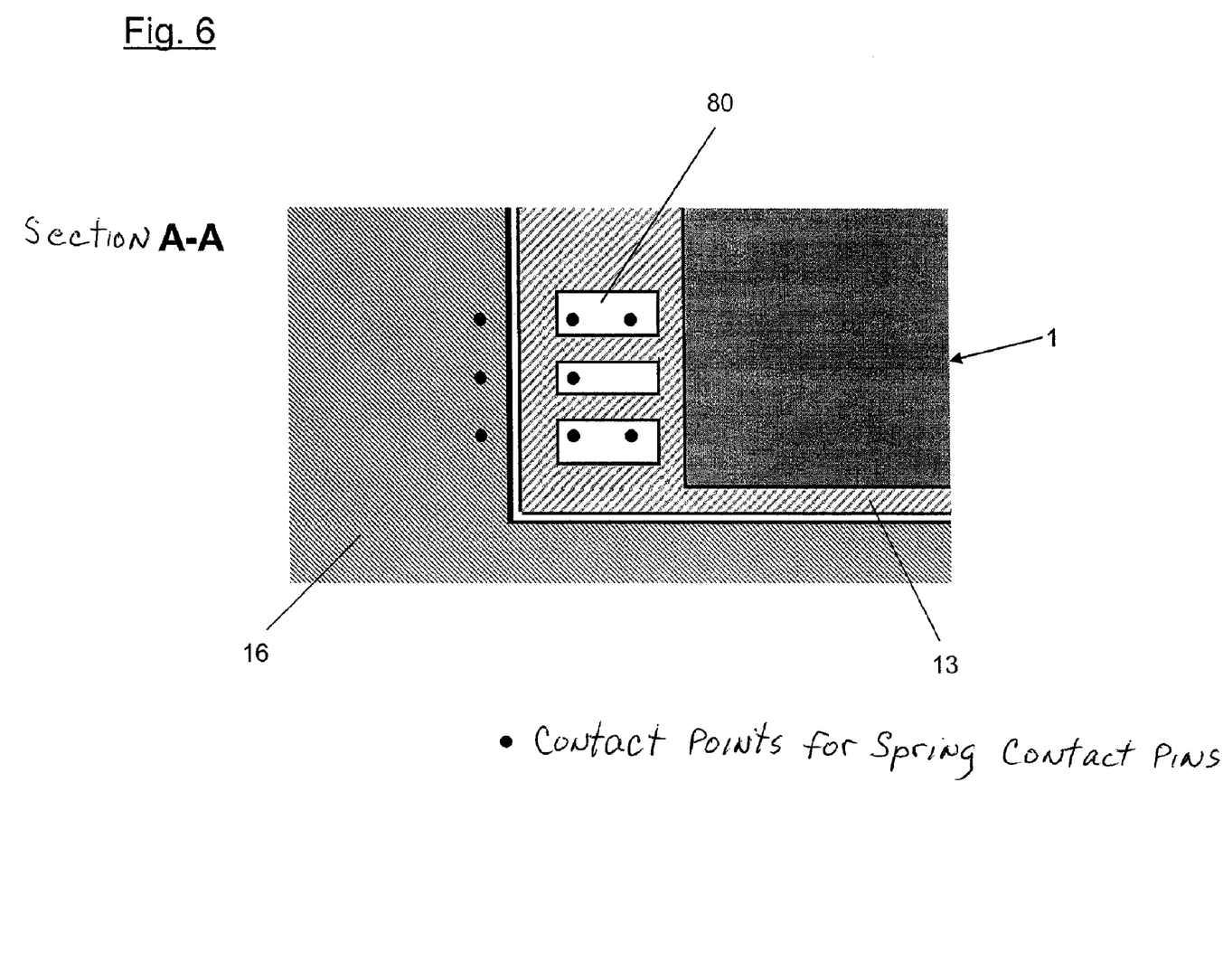
FIG. 6 shows contact elements at the transition from the T/R module to the contacting unit.

FIG. 6 is a view along Line A-A of FIG. 5. The metallic coplanar contact surfaces 80 are illustrated at the input/output of the T/R module 1. (The contact points of the spring contact pins within the contacting unit are also marked.) The ground/signal/ground transition is established by the three spring contact pins of the central row. To suppress waves which propagate in the contacting unit (the latter acting as a dielectric waveguide), additional spring contact pins for shielding the high-frequency signal are placed in the contacting unit (in FIG. 5, the left and the right row of contact pins) which surround the contact pins of the central row conducting the high-frequency signal. They cause a conducting of the high-frequency signal in the contacting unit 3 which follows a coaxial line. As a result, the performance of the ground/signal/ground transition from a coplanar line (T/R module) to a triplate line (line substrate) is significantly improved (uncoupling).

Figure 7:
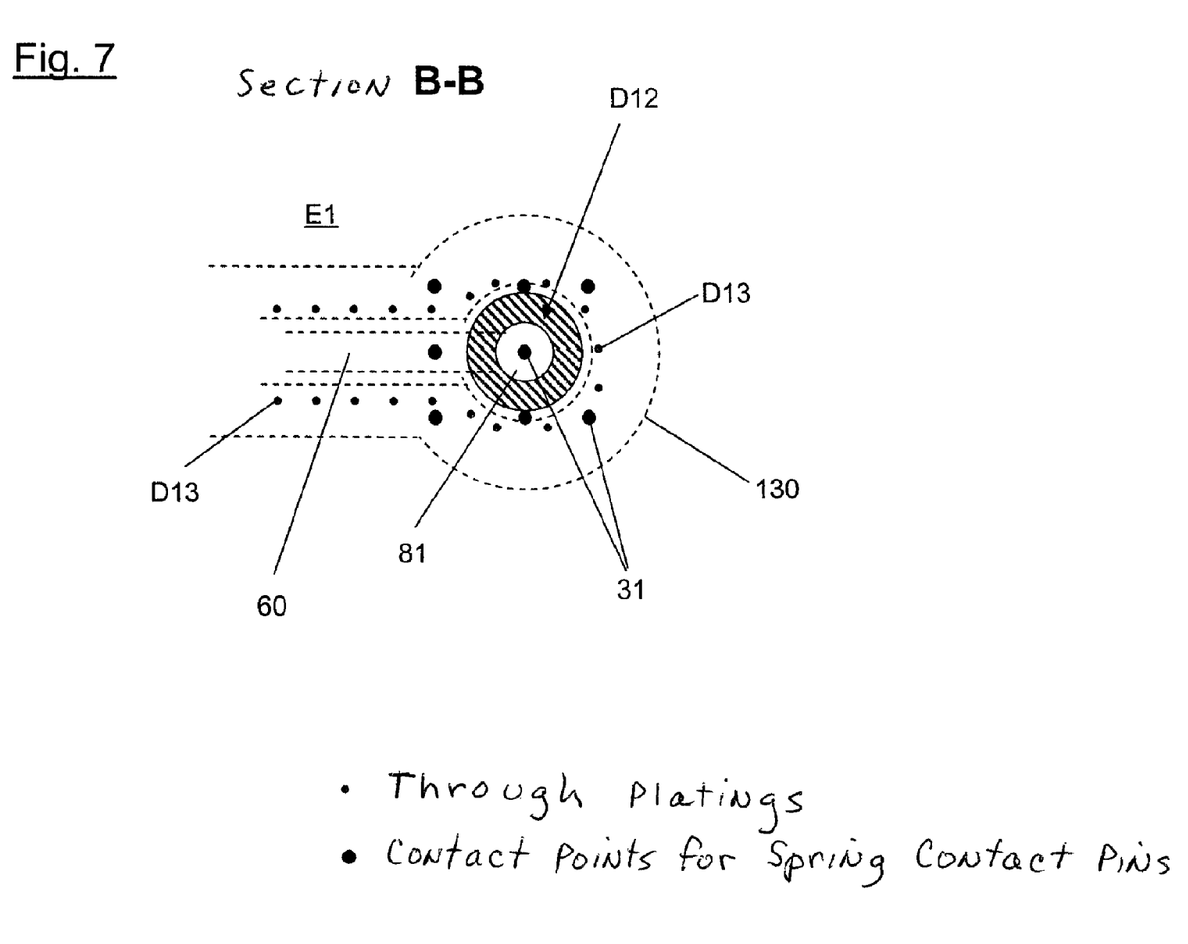
FIG. 7 shows contact elements at the transition from the contacting unit to the line substrate.

FIG. 7 shows the connection geometry for the high-frequency signal on the underside of the line substrate, and thus on the module-side metallization plane E1 of the triplate line (view along Line B-B in FIG. 5). The contact points 31 of the spring contact pins of the contacting unit 3 are also shown.

The high-frequency signal is conducted via the throughplating D12 (see also FIG. 2) to the central metallization plane E2 of the shielded triplate line. In the view of FIG. 7, this throughplating is situated behind the conductive contact surface 81 on which the contact point 31 of a spring contact pin is located. The ring-shaped non-metallized area of the metallization plane E1 surrounding this contact surface is shown in a hatched manner.

The throughplating D12 for conducting the high-frequency signal is surrounded within the line substrate 5 advantageously by additional throughplatings D13 for electrical connection of the module-side metallization plane and the metallization plane away from the module. Such throughplatings D13 also exist on both sides along the inner conductor 60 (shown by a broken line in FIG. 7) of the central metallization plane E2. In the central metallization plane, the throughplatings D13 are mutually connected by way of a metallization surface 130 (shown by a broken line). Corresponding to the position of the throughplatings D13, the metallization surface 130 surrounds the throughplating in a circular section which continues in two linear sections on both sides and parallel to the inner conductor 60.

These additional measures are provided for shielding and suppressing higher modes and the undesirable propagation of fields.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A system for making an electrical connection between a testing device and a transmit/receive module T/R for the transmission of high-frequency signals of an active antenna, said system comprising:
   a mechanically guided contacting unit having a plurality of contact elements for contacting the T/R module;
   a line substrate arranged on the contacting unit and electrically connected with it; and
   a trough configured to receive the T/R module such that the position of the T/R module relative to the mechanically guided contacting unit is roughly determined; wherein,
   the contacting unit has a frame-shaped configuration, such as to surround and engage with an outer periphery of the T/R module for making said contact;
   said frame-shaped configuration is such that engagement of said contacting unit with said T/R module causes said contacting unit to be positioned relative to the T/R module so that contact with the T/R module is established by way of the contact elements; and
   said line substrate comprises a shielded triplate line by which a high-frequency signal can be conducted to the testing device.

2. The system according to claim 1, wherein:
   an upper metalized plane and an upper substrate of said triplate line are removed at an end of the triplate line, providing a transition to a shielded coplanar line; and
   a connector for connecting a coaxial line is mounted at said end of the triplate line.

3. The system according claim 2, wherein the coplanar line is connected with a coaxial connector for connecting the testing device.

4. The system according to claim 3, wherein throughplatings between the module-side metallization plane of the triplate line and the metallization plane away from the module, are provided on the triplate line along an outer contour of the coaxial connector.

5. The system according to claim 1, wherein:
   the contact elements of the contacting unit are constructed as spring contact pins; and
   during the contacting, said spring contact pins come in contact with metallic contact surfaces on the line substrate and the T/R module.

6. The system according to claim 5, wherein contact elements that establish a ground/signal/ground transition of the contacting unit are surrounded by further contact elements for shielding the high-frequency signal.

7. The system according to claim 1, wherein the high-frequency signal is conducted via a throughplating, from a module-side metallization plane to a central metallization plane of the triplate line.

8. The system according to claim 7, wherein the throughplating for the high-frequency signal is surrounded by throughplatings between the module-side metallization plane and the metallization plane away from the module, of the triplate line.

9. The system according to claim 1, further comprising additional throughplatings between the module-side metallization plane and the metallization plane away from the module, on both sides along the inner conductor of the central metallization plane.

10. The system according to claim 8, wherein the throughplatings are mutually connected between the module-side metallization plane and the metallization plane away from the module, in the central metallization plane by means of a metallization surface.

11. The system according to claim 1, wherein:
   the line substrate and additional contact pins inside the contacting unit are configured to accommodate transmission of direct-current signals and control signals between a conductor card arranged on the line substrate and the T/R module; and
   signal guidance takes place within the module-side metallization plane of the triplate line.

12. The system according to claim 1, further comprising a pressure plate which presses upon a housing of the T/R module, which pressure plate has a step-shaped construction on at least one of its edges.

* * * * *